United States Patent
Sills et al.

(10) Patent No.: US 8,268,543 B2
(45) Date of Patent: Sep. 18, 2012

(54) METHODS OF FORMING PATTERNS ON SUBSTRATES

(75) Inventors: Scott Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 367 days.

(21) Appl. No.: 12/409,308

(22) Filed: Mar. 23, 2009

(65) Prior Publication Data

US 2010/0239983 A1 Sep. 23, 2010

(51) Int. Cl.
*G03F 7/26* (2006.01)
(52) U.S. Cl. .......................................... 430/322
(58) Field of Classification Search .................. 430/311, 430/322, 323
See application file for complete search history.

(56) References Cited

U.S. PATENT DOCUMENTS

| | | |
|---|---|---|
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,905,279 A | 5/1999 | Nitayama et al. |
| 6,063,688 A | 5/2000 | Doyle et al. |
| 6,087,263 A | 7/2000 | Clampitt et al. |
| 6,140,217 A | 10/2000 | Jones et al. |
| 6,207,490 B1 | 3/2001 | Lee |
| 6,249,335 B1 | 6/2001 | Hirukawa et al. |
| 6,352,932 B1 | 3/2002 | Clampitt et al. |
| 6,383,952 B1 | 5/2002 | Subramanian et al. |
| 6,483,136 B1 | 11/2002 | Yoshida et al. |
| 6,545,904 B2 | 4/2003 | Tran |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |

(Continued)

FOREIGN PATENT DOCUMENTS

CN 1761063 4/2006

(Continued)

OTHER PUBLICATIONS

A Flexible Gate Array Architecture for High-speed and High-Density Applications; Mar. 1996 Gallia et al.; 430-436.

(Continued)

*Primary Examiner* — Kathleen Duda
*Assistant Examiner* — Brittany Raymond
(74) *Attorney, Agent, or Firm* — Wells St. John, P.S.

(57) ABSTRACT

A method of forming a pattern on a substrate includes forming spaced first features over a substrate. The spaced first features have opposing lateral sidewalls. Material is formed onto the opposing lateral sidewalls of the spaced first features. That portion of such material which is received against each of the opposing lateral sidewalls is of different composition from composition of each of the opposing lateral sidewalls. At least one of such portion of the material and the spaced first features is densified to move the at least one laterally away from the other of the at least one to form a void space between each of the opposing lateral sidewalls and such portion of the material.

35 Claims, 12 Drawing Sheets

U.S. PATENT DOCUMENTS

| | | |
|---|---|---|
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,735,132 B2 | 5/2004 | Siek |
| 6,753,220 B2 | 6/2004 | Juengling |
| 6,756,619 B2 | 6/2004 | Tran |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,905,975 B2 | 6/2005 | Boettiger et al. |
| 6,916,594 B2 | 7/2005 | Bok et al. |
| 6,951,822 B2 | 10/2005 | Scholz |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,320,911 B2 | 1/2008 | Basceri et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,682,924 B2 | 3/2010 | Bhat et al. |
| 7,713,818 B2 | 5/2010 | Chan |
| 7,790,360 B2 | 9/2010 | Alapati et al. |
| 7,842,601 B2 | 11/2010 | Lee et al. |
| 7,851,135 B2 | 12/2010 | Jung et al. |
| 8,083,953 B2 | 12/2011 | Millward et al. |
| 8,083,958 B2 | 12/2011 | Li et al. |
| 2002/0037617 A1 | 3/2002 | Kim et al. |
| 2002/0094688 A1 | 7/2002 | Mitsuiki |
| 2003/0001214 A1 | 1/2003 | Yoshida et al. |
| 2003/0006410 A1* | 1/2003 | Doyle ........................... 257/20 |
| 2003/0091936 A1 | 5/2003 | Rottstegge et al. |
| 2004/0043546 A1 | 3/2004 | Yoshida et al. |
| 2004/0198065 A1* | 10/2004 | Lee et al. ...................... 438/725 |
| 2005/0130068 A1 | 6/2005 | Kondoh et al. |
| 2005/0164478 A1 | 7/2005 | Chan et al. |
| 2005/0173740 A1 | 8/2005 | Jin |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0088788 A1 | 4/2006 | Kudo et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0273456 A1 | 12/2006 | Sant et al. |
| 2006/0278911 A1 | 12/2006 | Eppich |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Yoshida et al. |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshnell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1* | 8/2007 | Jung ........................... 438/669 |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238299 A1 | 10/2007 | Niroomand et al. |
| 2007/0248916 A1 | 10/2007 | Kamijima |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0074958 A1 | 3/2009 | Xiao |
| 2009/0117739 A1 | 5/2009 | Shin et al. |
| 2009/0130612 A1* | 5/2009 | Yang ........................... 430/327 |
| 2009/0130852 A1 | 5/2009 | Kewley |
| 2009/0212016 A1* | 8/2009 | Cheng et al. ..................... 216/67 |
| 2009/0291397 A1 | 11/2009 | deVilliers |
| 2010/0009512 A1 | 1/2010 | Fishburn |
| 2010/0068656 A1* | 3/2010 | Yeh et al. ...................... 430/323 |
| 2010/0130015 A1 | 5/2010 | Nakajima et al. |
| 2010/0130016 A1 | 5/2010 | deVilliers |
| 2010/0144150 A1 | 6/2010 | Sills et al. |

| | | | |
|---|---|---|---|
| 2010/0144151 | A1 | 6/2010 | Sills et al. |
| 2010/0144153 | A1 | 6/2010 | Sills et al. |
| 2010/0203740 | A1 | 8/2010 | Li |

FOREIGN PATENT DOCUMENTS

| | | |
|---|---|---|
| EP | 0171111 | 2/1986 |
| JP | 56046531 | 4/1981 |
| JP | 58157135 | 9/1983 |
| JP | 59211231 | 11/1984 |
| JP | 1994077180 A | 3/1994 |
| JP | 2002217170 A | 8/2002 |
| JP | 2003234279 | 8/2003 |
| JP | 2004247399 | 9/2004 |
| JP | 2006245625 | 9/2006 |
| JP | 2008-072101 | 3/2008 |
| KR | 20030049198 | 6/2003 |
| KR | 20030056601 | 7/2003 |
| KR | 20030089063 | 11/2003 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 B1 | 12/2007 |
| KR | 10-2008-0039006 | 5/2008 |
| WO | WO 2007/027558 | 3/2007 |

OTHER PUBLICATIONS

PCT/US2009/039793; Search Report mailed Oct. 30, 2009; 4 pp.
PCT/US2009/039793; Written Opinion mailed Oct. 30, 2009; 5 pp.
PCT/US2009/041500; Search Report mailed Dec. 7, 2009; 3 pp.
PCT/US2009/041500; Written Opinion mailed Dec. 7, 2009; 3 pp.
PCT/US2007/015729; Search Report mailed Jan. 2, 2008; 3 pp.
PCT/US2007/015729; Written Opinion mailed Jan. 2, 2008; 7 pp.
Innovative Solutions to Enhance the Legacy Equipments Towards "One Generation ahead" in Flip chip BGA 0.8mm Ball Pitch Technology; Sep. 2005; EE et al.; 4 pp.
Polysilazane SODs Spinful 400 Series for STI/PMD Application; Clariant; At least as early as Oct. 19, 2009; 1 pp.
Advanced cell Structures for Dynamic RAMs; Jan. 1989; Lu; pp. 27-36.
U.S. Appl. No. 11/714,378, filed Mar. 5, 2007, Preliminary Amendment.
U.S. Appl. No. 12/125,725, filed May 22, 2008, deVilliers.
U.S. Appl. No. 12/328,435, filed Dec. 4, 2008, Sills et al.
U.S. Appl. No. 12/328,448, filed Dec. 4, 2008, Sills et al.
U.S. Appl. No. 12/328,464, filed Dec. 4, 2008, Sills et al.
Fritze et al., "Enhanced Resolution for Future Fabrication", IEEE Circuits & Devices Magazine, Jan. 2003, pp. 43-47.
Hori et al., "Sub-40nm Half-Pitch Double Patterning with Resist Freezing Process", Proc. of SPIE vol. 6923 (2008) pp. 69230H-1 through 69230H-8.
Lee et al., "Double-Patterning Technique Using Plasma Treatment of Photoresist", Japanese Journal of applied Physics, vol. 46, No. 9B, 2007, pp. 6135-6139.
Liau et al., "Softbake and Post-exposure Bake Optimization for Process Window Improvement and Optical Proximity Effect Tuning", ICSE 2006 Proc. 2006, Kuala Lumpur, Malaysia, 7 pgs.
Ma, "Plasma Resist Image Stabilization Technique (PRIST)", IEEE 1980, pp. 574-575.
Owa et al., "Immersion Lithography Ready for 45nm Manufacturing and Beyond", 2007 IEEE/SEMI Advanced Semiconductor Manufacturing Conference, pp. 238-244.
Pease et al., "Lithography and Other Patterning Techniques for Future Electronics", Proceedings of teh IEEE/vol. 96, No. 2, Feb. 2008, pp. 248-270.
Tan et al., "Current Status of Nanonex Nanoimprint Solutions", website: www.nanonex.com/technology,htm 2004, 9 pgs.
Terai et al., "Newly developed RELACS process and materials for 65nm node device and beyond", sebsite: ieeexplore.ieee.org/iel5/10631/33565/01595193.pdf, pp. 20-21.
WO PCT/US2009/063978, May 31, 2010, Search Report.
WO PCT/US2009/063978, May 31, 2010, Written Opinion.
WO PCT/US2009/063999, May 31, 2010, Search Report.
WO PCT/US2009/063999, May 31, 2010, Written Opinion.
WO PCT/US2009/064004, May 31, 2010, Search Report.
WO PCT/US2009/064004, May 31, 2010, Written Opinion.
WO PCT/US2009/039793, Nov. 9, 2010, IPRP.
WO PCT/US2010/025495, Sep. 29, 2010, Search Report.
WO PCT/US2010/025495, Sep. 29, 2010, Written Opinion.
U.S. Appl. No. 13/101,485, filed May 5, 2011, Light et al.
WO PCT/US2009/036978, Jun. 16, 2011, IPRP.
WO PCT/US2009/041500, Dec. 2, 2010, IPRP.
WO PCT/US2009/063999, Jun. 16, 2011, IPRP.
WO PCT/US2009/064004, Jun. 16, 2011, IPRP.
WO PCT/US2010/055488, Jun. 27, 2011, Written Opinion.
WO PCT/US2010/055488, Jun. 27, 2011, Search Report.
WO PCT/US2010/025495, Sep. 27, 2011, IPRP.

* cited by examiner

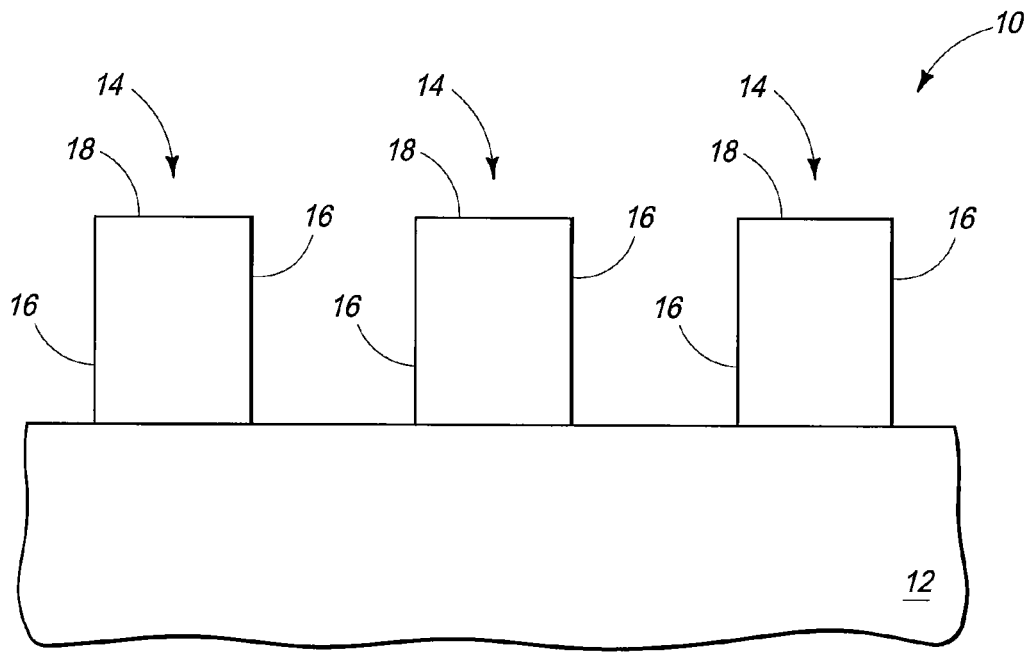
_FIG. 1_
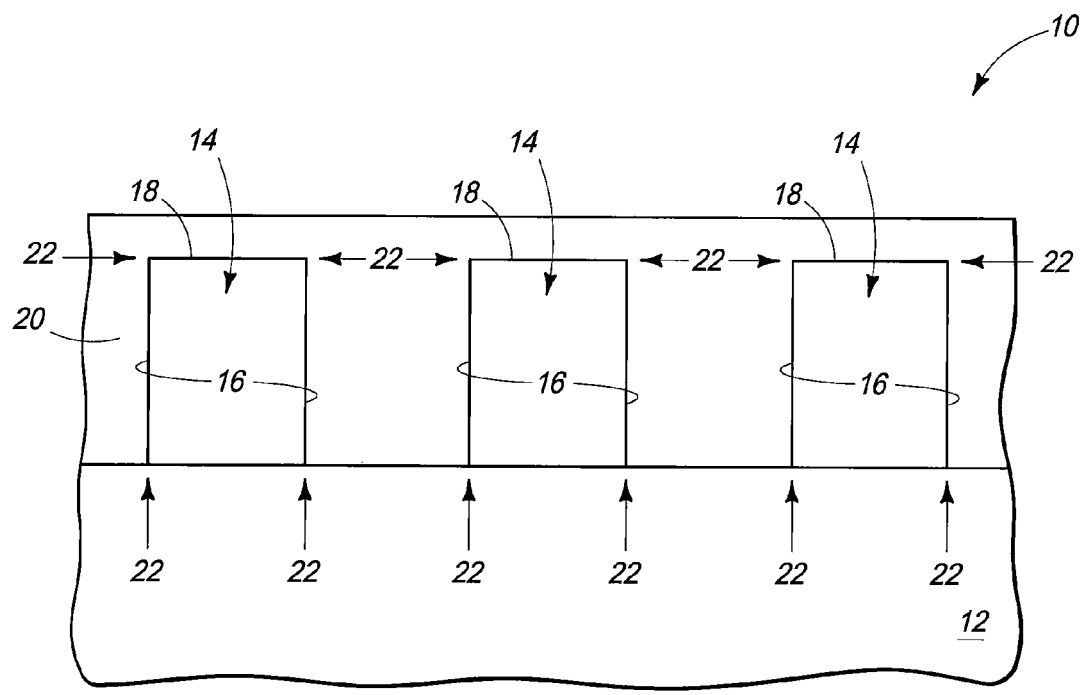
_FIG. 2_

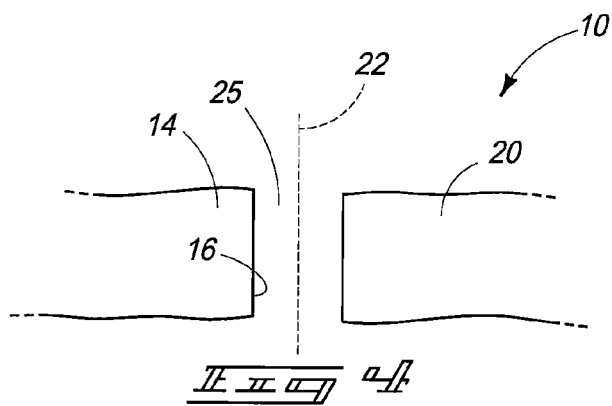
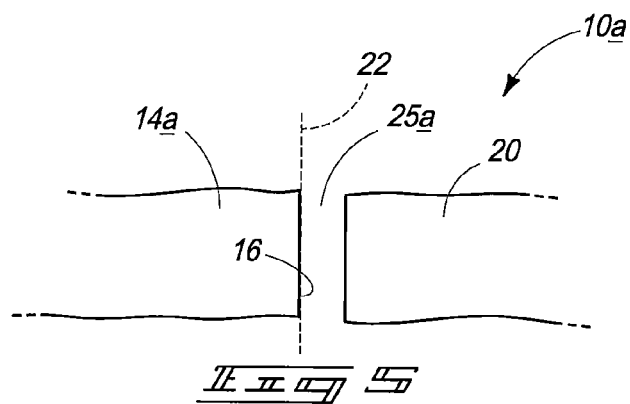
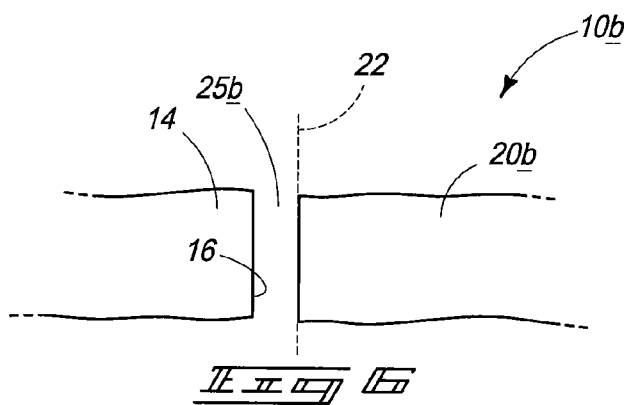
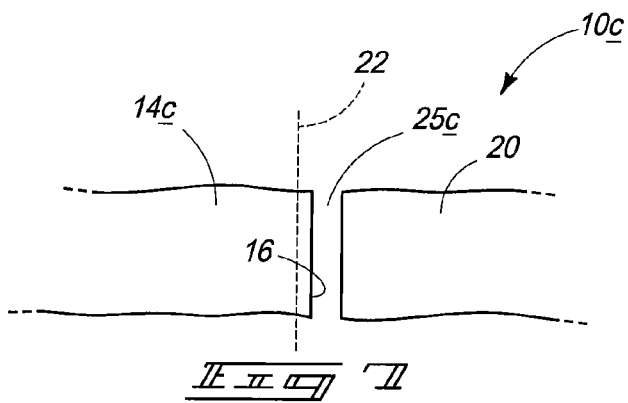

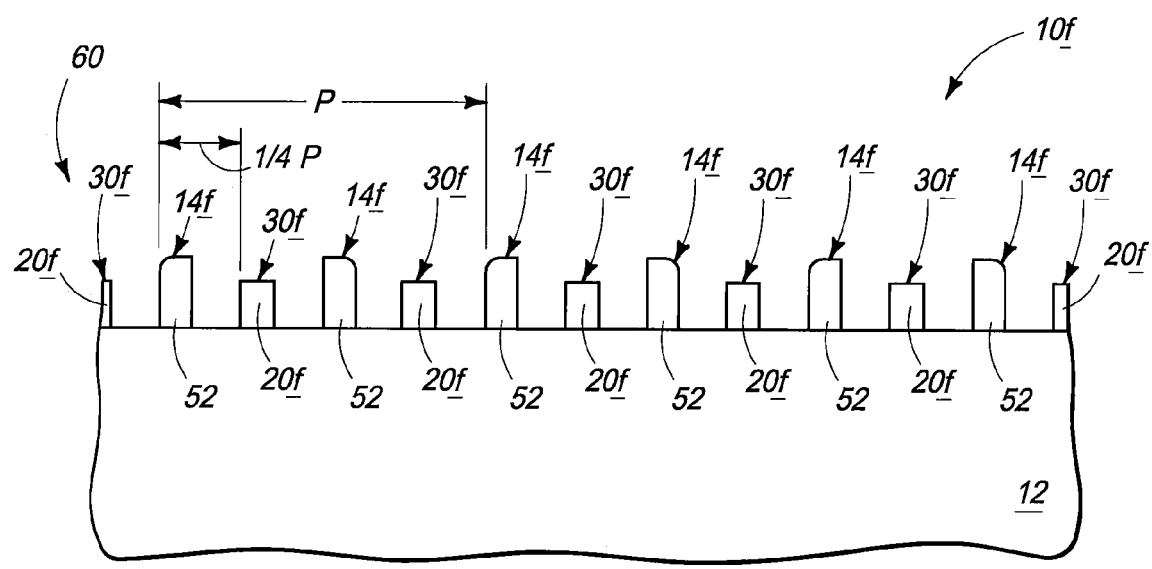

METHODS OF FORMING PATTERNS ON SUBSTRATES

TECHNICAL FIELD

Embodiments disclosed herein pertain to methods of forming patterns on substrates.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized. Further, patterns may be formed on substrates without using photoresist.

The continual reduction in feature sizes places ever greater demands on the techniques used to form the features. For example, photolithography is commonly used to form patterned features, such as conductive lines. A concept commonly referred to as "pitch" can be used to describe the sizes of the repeating features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

BRIEF DESCRIPTION OF THE DRAWINGS

FIG. 1 is a diagrammatic sectional view of substrate in process in accordance with an embodiment of the invention.

FIG. 2 is a view of the FIG. 1 substrate at a processing step subsequent to that shown by FIG. 1.

FIG. 4 is an enlarged view of a portion of the FIG. 3 substrate.

FIG. 5 is a view of an alternate embodiment substrate, and corresponds in scale and position to that of FIG. 4.

FIG. 6 is a view of an alternate embodiment substrate, and corresponds in scale and position to that of FIG. 4.

FIG. 7 is a view of an alternate embodiment substrate, and corresponds in scale and position to that of FIG. 4.

FIG. 24 is a view of the FIG. 23 substrate at a processing step subsequent to that shown by FIG. 23.

DETAILED DESCRIPTION OF EXAMPLE EMBODIMENTS

Figure 3:
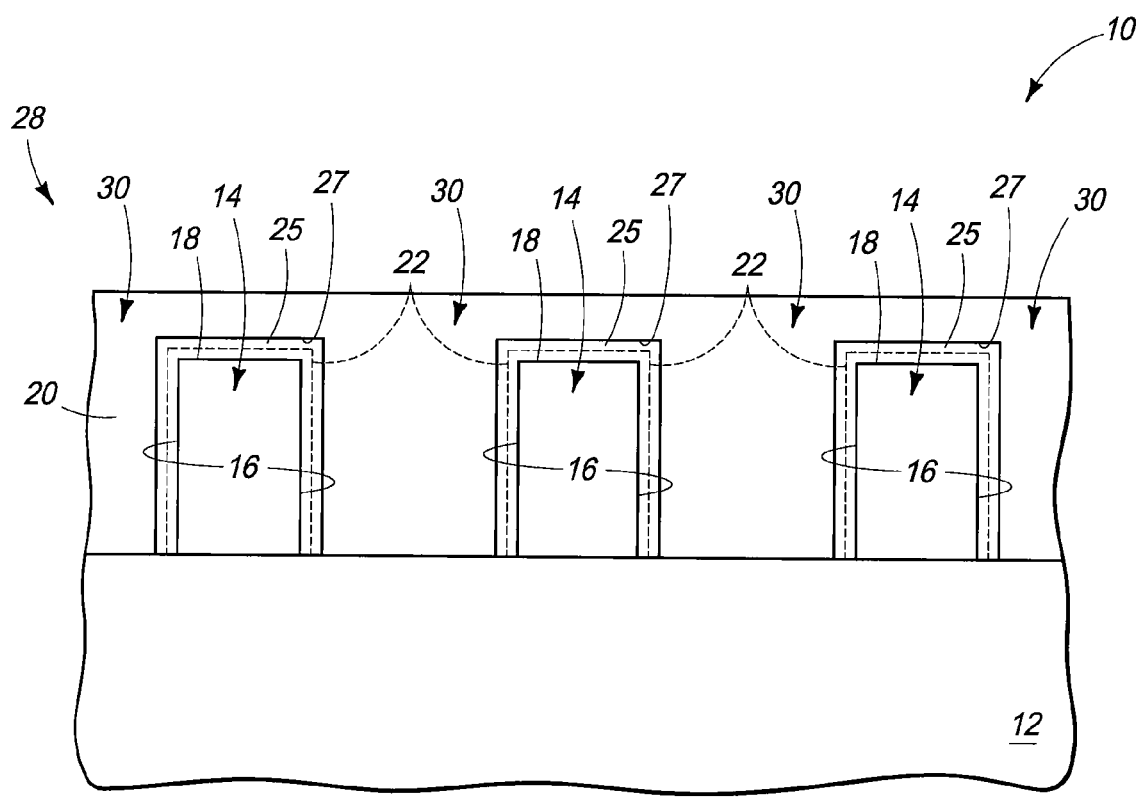
FIG. 3 is a view of the FIG. 2 substrate at a processing step subsequent to that shown by FIG. 2.

Example methods of forming patterns on substrates of some embodiments of the invention are described with reference to FIGS. 1-24. Referring to FIG. 1, a substrate fragment is indicated generally with reference numeral 10. Such may comprise a semiconductor or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate fragment 10 comprises substrate material 12, for example which may be homogenous or non-homogenous and include any of conductive, semiconductive, and insulating materials. Such might, for example, be used in the fabrication of integrated circuitry. Spaced first features 14 have been formed over substrate 12, and may also be homogenous or non-homogenous. Such may be partially or wholly sacrificial, and accordingly may or may not comprise a part of a finished circuitry construction where circuitry is being fabricated. Spaced first features 14 may be fabricated by any existing or yet-to-be developed technique. Examples include lithography, for example photolithography. Spaced first features 14 may be patterned at, greater than, or less than the minimum photolithographic resolution with which substrate 10 is fabricated. Spaced first features 14 are shown as being of the same shape and spacing relative one another and as being generally rectangular in cross-section. Other shapes, differing shapes among the features, and two or more different spacings may be used. Individual of the spaced first features 14 may be considered as comprising opposing lateral sidewalls 16 and an elevationally outermost top wall or surface 18. In one embodiment, sidewalls 16 are generally parallel one another. In one embodiment, sidewalls 16 are generally parallel one another and extend generally orthogonally relative to substrate 12.

Referring to FIG. 2, material 20 has been formed onto opposing lateral sidewalls 16 of spaced first features 14, and over elevationally outermost surfaces/top walls 18 of spaced first features 14. Material 20 may or may not be homogenous, and regardless may or may not form a part of finished integrated circuitry construction where integrated circuitry is being fabricated. Regardless, that portion of material 20 which is received against each of opposing lateral sidewalls 16 is of different composition from composition of each of opposing lateral sidewalls 16. Further, where material 20 is received over and against elevationally outermost surfaces/top walls 18, that portion of material 20 which is received against a surface/wall 18 may be of different composition from composition of surface/wall 18. For purpose of the continuing discussion, material 20 and spaced first features 14 may be considered as contacting against one another at respective interfaces 22. Example compositions for those portions of material 20 and spaced first features 14 contacting at such interfaces 22 are described in more detail below.

Referring to FIGS. 3 and 4, at least one of the portion of material 20 received against lateral sidewalls 16 and the spaced first features 14 is densified to move at least one of such portion of material 20 or spaced first features 14 away from the other to form a void space 25 between each of opposing lateral sidewalls 16 and the portion of material 20 previously received there-against. FIGS. 3 and 4 depict an example embodiment wherein both material 20 and spaced first features 14 have been densified such that material of each moves laterally away from interfaces 22. FIG. 3 also depicts densifying at least one of the portions of material 20 against top walls 18 or spaced features 14 such that void spaces 25 extend across and over top walls 18 of each spaced first feature 14. In one embodiment, for example as shown in FIG. 3, substrate 10 has been treated to form void space 25 to be of an upside-down generally U-shape (having a base 27), and received about each of spaced first features 14 in the example depicted cross-section. Composition of material 20 and/or composition of the material of spaced first features 14 after the densification may be the same or different from such compositions prior to densification of either. Regardless, depending upon composition of the various materials, the void space which is formed may be received only between one lateral sidewall 16 or both lateral sidewalls 16 and portion(s) of material 20 previously received there-against without being formed atop features 14.

Regardless, FIG. 3 depicts an example pattern 28 formed over substrate 12. Pattern 28 may be considered as comprising interconnected spaced second features 30 which comprise material 20, with spaced second features 30 being spaced from and received between spaced first features 14.

FIGS. 5 and 6 depict alternate example embodiment substrate fragments 10a and 10b. Like numerals from the first described embodiment have been used where appropriate, with some construction differences being indicated with the suffix "a" and "b", respectively. FIG. 5 depicts an example wherein only that portion of material 20 previously received at interface 22 has moved laterally away from the other of spaced first feature material 14a to form void space 25a. FIG. 6 depicts an example wherein only spaced first feature material 14 previously received at interface 22 has moved laterally away from interface 22. Accordingly, the act of densifying and moving to form void space 25a or 25b results from densification and movement of only one material relative to the other, as opposed to both as shown in the embodiment of FIGS. 3 and 4.

FIG. 7 depicts another example embodiment substrate fragment 10c. Like numerals from the above-described embodiments are utilized where appropriate, with some construction differences being indicated with the suffix "c". In FIG. 7, material of spaced first features 14c has actually expanded, thereby reducing its density, and moved toward the portion of material 20 which was previously received at interface 22. The densification of material 20 has been greater than the expansion of material of feature 14c such that a void space 25c forms. Such may of course be reversed, for example wherein material 20 is caused to expand and material 14 is caused to densify (not shown) at a greater rate than the expansion of material 20 to form a void space.

Different compositions may be selected by the artisan for material 20 and that of spaced first features 14 to enable densification of one or both materials relative to the other such that a void space is created. Further, depending on the materials chosen, densification may be achieved in different manners. For example, one or both of the spaced first features 14 and material 20 may comprise different composition photoresists. Densification of one or both relative to the other to create a void space may, for example, occur by actinically irradiating the example substrate of FIG. 2, and/or densification may occur by heating the substrate of FIG. 2. Ideally, densification occurs in the absence of any etching of material of substrate 10 such that void formation occurs by densification alone.

As an additional example, certain as-cast polymers may shrink and thereby be densified by an annealing which drives solvent therefrom. For example, first features 14 may comprise any suitable photoresist, with material 20 formed thereover comprising polymethylmethacrylate. For example, heating the substrate of FIG. 2 comprised of polymethylmethacrylate 20 and photoresist 14 at a temperature of at least 50° C. (ideally from 100° C. to 130° C.) for approximately 60 seconds to 90 seconds will cause densification of either, and commensurate formation of void space 25. Further as an example, if first features 14 are resist, or any polymer, such may or may not be treated prior to forming material 20 there-over such that the treatment renders first features 14 insoluble in the solvent from which material 20 is solvent (spin) cast, if material 20 is solvent cast. Example treatments include conventional resist "freezing" techniques used in double patterning, e.g. thermal cross-linking, photo cross-linking, thermal generation of acid followed by photo-induced acid catalyzed polymerization, or formation of a protective encapsulation layer over first features 14, for example forming an insoluble chemical coating or forming a thin insoluble coating by atomic layer deposition of, for example, oxide.

Densification with commensurate volume change may also occur by reaction of certain materials, for example by thermolytic cleavage or acid hydrolysis of material, such as in transformation of polytert-butyl acrylate to polyacrylic acid. Other example materials which undergo densification and volume change upon reaction include thermally curable epoxy resins, for example vinyl esters, unsaturated polyesters, and blends thereof. Such may, for example, be cured with suitable elevated temperatures at or below 100° C. Other epoxy resins and blends thereof may be cured at, for example, higher temperatures from 120° C. to 500° C. Where such is used for all or some of material 20, first features 14 may not comprise photoresist or other material not capable of being processed at such temperatures without melting. Accordingly in such instances, spaced first features 14 might be fabricated of any suitable, existing, or yet-to-be developed hardmask material which itself was previously patterned utilizing photolithography and/or in other manner.

Densification and commensurate volume change may also occur by actinic irradiation, such as by photo-polymerization of acrylate or epoxy monomers or prepolymers in the presence of photo-activated radicals or cationic initiators. For example, urethane dimethacrylate is photo-polymerized with visible light to impart a densification and volume shrinking of 5.3%. Analogously, the monomers or prepolymers may themselves be photosensitive and a separate initiator species may not be present. Examples include fully imidized, soluble, auto-photosensitive polyimides. Regardless, example such photoresists may be positive or negative.

As further examples, certain positive photoresists may be caused to shrink due to outgassing of byproducts of the photochemical process, including removal of protecting groups from the resist molecule. An example is deprotection of tert-butoxycarbonyl, acetal, or tert-butyl acrylate groups, including copolymers thereof, for example comprised of hydroxystyrene monomers. The photo or acid cleaved protecting group may outgas from the resist film during either exposure and/or post-exposure bake. Additional examples of densification of positive photoresist by out-gassing include formation of byproducts in the photoacid generation process in chemically amplified resists. Examples include where the photoacid generator molecule is an onium salt, for example sulfonium perfluorosulfonate, and wherein the anion generated during photolysis and remains of the reacted cation may outgas from the resist film during either exposure and/or post-exposure bake.

Other example material capable of undergoing densification and commensurate volume change upon suitable treating include thermo-responsive polymer gels, for example hydrogels such as poly (N-isopropylacrylamide). Thermo-responsive hydrogels swell below and shrink above their lower critical solution temperature. For poly(N-isopropylacrylamide), such occurs due to a reversible formation and cleavage of hydrogen bonds between NH or C=O groups and the surrounding water molecules with changing temperature. Other hydrogel trigger stimuli (other than temperature) for certain thermo-responsive hydrogels include electric field, pH, and/or third-body solute concentration.

Additional example materials include those which may be thermally shrunk, such as shrink-wrap materials. Such materials may be deposited with stretching provided via sheer thinning during film casting. Example materials include linear molecules like polyvinylchloride or polyolefins such as polyethylene. Additional examples include segmented block copolymers and elastomer-plastic blends, for example a copolymer of ethylene and vinyl acetate, including blends thereof. Densification and commensurate volume change to form voids may occur during a post-coat thermal bake where, for example, mobility is imparted to the stretched polymer molecules and they contract to an equilibrium coiled configuration.

Additional example materials which may be treated to impart densification and thereby volume change to form a void space include reversibly doped conjugated polymers, for example polypyrrole. Such materials undergo reversible volume change during doping and undoping thereof. For example, an electrically conducting reversibly doped conjugated polymer such as polypyrrole may be submersed in an electrolyte solution. When a suitable voltage (electric field) is applied to the polymer, ions are exchanged between the polymer and electrolyte. As a result of charge and mass transport therefrom, the polymer undergoes a volume change by densification up to several percent. In polypyrrole, for example, the volume change is primarily due to physical separation of the chains due to dopant insertion or extraction. If ions are expelled from the polymer, it shrinks and increases in density.

By way of example only, various of the above materials and techniques may be selected at least for those portions of spaced first features 14 and material 20 which come into contact relative to one another at interfaces 22 to result in desired formation of suitable void spaces 25/25a/25b/25c. Regardless, interface 22 where void formation nucleates ideally promotes dewetting or separation during the shrinking process, or at least does not encompass strong adhesion of one material relative to the other. In one example, interfaces where void formation nucleates are ideally chemically specific so as to promote dewetting or separation of the different composition materials during the densification process. For example, opposing lateral sidewalls 16 and/or top wall 18 may be treated prior to or during deposition of material 20 thereover. Chemical tailoring of surfaces 16/18 may include selective fluorocarbon polymer formation via fluorine plasma etching. Further, diffusion and surface migration of fluorinated components of many photoresist materials will inherently facilitate dewetting or separation. Additionally or alternately, functionalized self-assembled monomers may be selectively deposited onto the surfaces of spaced first features 14 prior to deposition of material 20. Ideally, the interface between the shrinking material(s) and the underlying substrate is such that the contact angle between the shrinking material and the underlying substrate is approximately 90°, which may or may not be achieved through separate chemical functionalization of the material(s) which will be densified.

Figure 8:
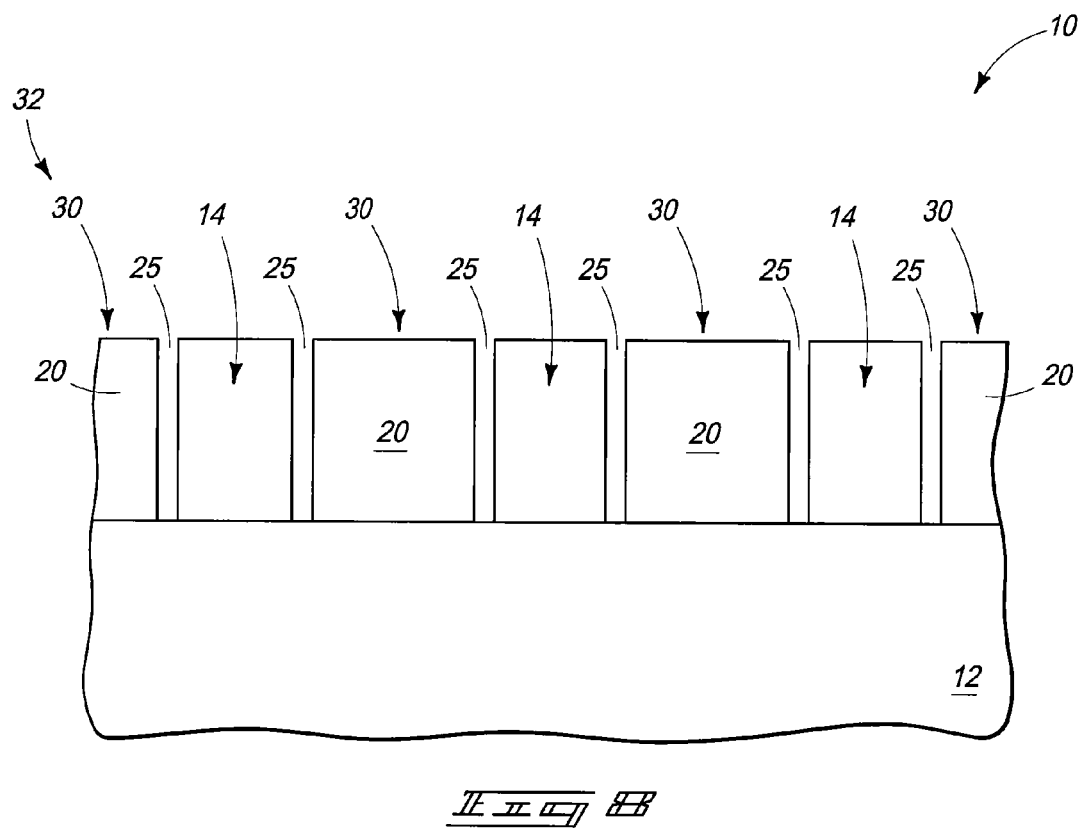
FIG. 8 is a view of the FIG. 3 substrate at a processing step subsequent to that shown by FIG. 3.

FIG. 3 depicts an example wherein void space 25 upon initial formation is sealed elevationally outward by material 22 in the depicted cross-section. Referring to FIG. 8, some of material 20 has been removed to open void spaces 25 elevationally outward after their initial formation. Such forms a pattern 32 wherein spaced second features 30 are disconnected and spaced from and alternate with spaced first features 14. Accordingly, FIG. 8 depicts modification of pattern 28 of FIG. 3 to form a pattern 32 on substrate 12. Regardless, alternate processing may occur.

Figure 9:
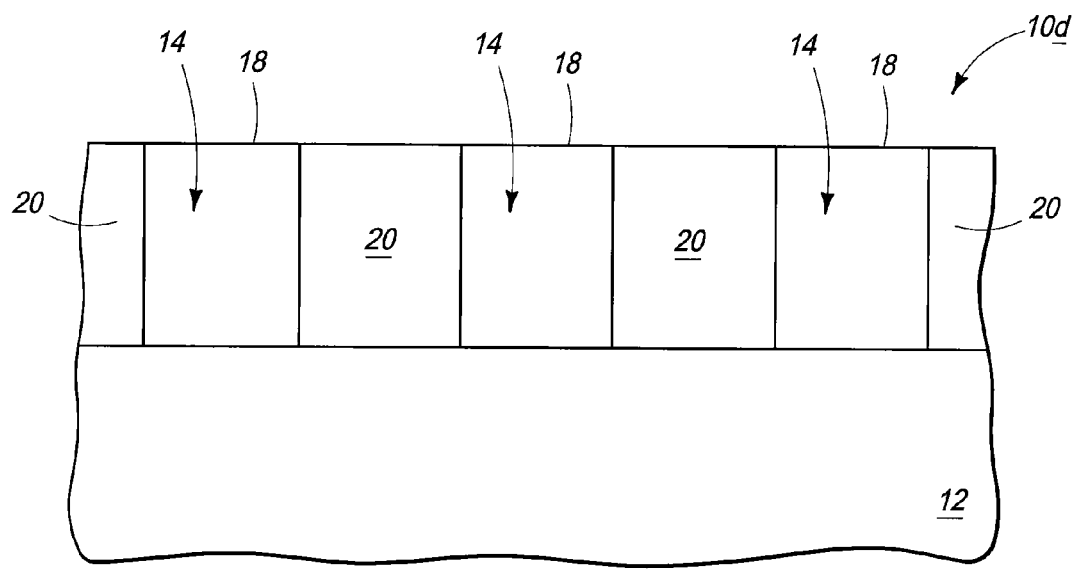
FIG. 9 is a view of an alternate embodiment substrate.

For example, FIGS. 2-4 depict an embodiment wherein material 20 is received elevationally over outermost surfaces 18 of spaced first features 14 during the act of densification to form void spaces 25. Alternately, material 20 may be removed from being received over elevationally outermost surfaces of spaced first features 14 during the densification. For example, FIG. 9 depicts a substrate fragment 10d. Like numerals from the first-described embodiment have been utilized where appropriate, with some construction differences being indicated with the suffix "d". Such depicts subsequent processing to that depicted by FIG. 2 wherein material 20 has been chemically etched, polished, or otherwise removed inwardly at least to elevationally outermost surfaces 18 of spaced first features 14. Densification of the FIG. 9 substrate could thereafter be processed to directly produce the substrate of FIG. 8. Accordingly in such example embodiment, void spaces 25 which are created are open elevationally outward in cross-section upon initial formation, which for example would occur when no material is received over elevationally outermost surfaces 18 of spaced first features 14 during the densification.

Figure 10:
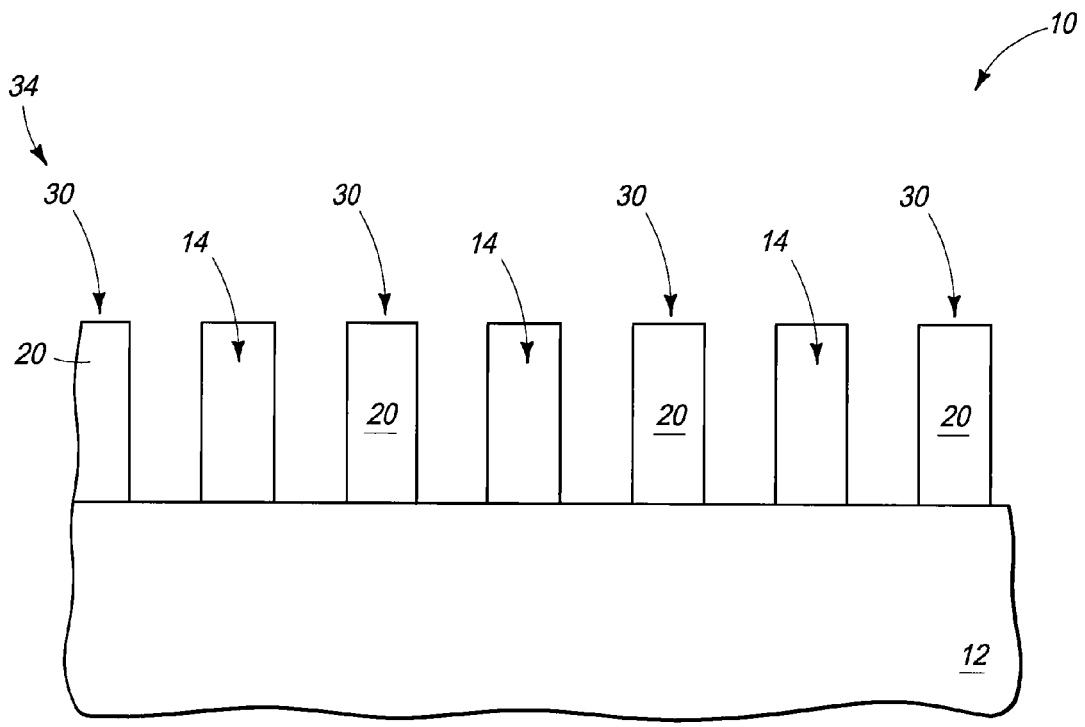
FIG. 10 is a view of the FIG. 8 substrate at a processing step subsequent to that shown by FIG. 8.

Pattern 32 formed over substrate 10 may or may not comprise a part of the finished construction of substrate 10. Further, pattern 32 may be subsequently modified, regardless. For example, one or both of spaced first features 14 and spaced second features 30 of FIG. 8 may be laterally trimmed to reduce their respective widths. FIG. 10 depicts an example embodiment pattern 34 wherein the respective widths of each of spaced second features 30 and spaced first features 14 has been laterally trimmed (for example by suitable wet and/or dry chemical etching) to reduce their respective widths. Depending upon composition of spaced first features 14 and spaced second features 30 in FIG. 8, the FIG. 10 lateral trimming may occur at the same time using a single chemistry. Alternately or additionally, the lateral trimming of spaced first features 14 and spaced second features 30 may occur at different times using different etching chemistries, with such act of lateral trimming occurring with respect to either before the other. Further, only one or neither of such spaced features may be trimmed. Further, spaced first features 14 of FIG. 1 may be laterally trimmed after formation and prior to deposition of material 20 thereover.

Figure 11:
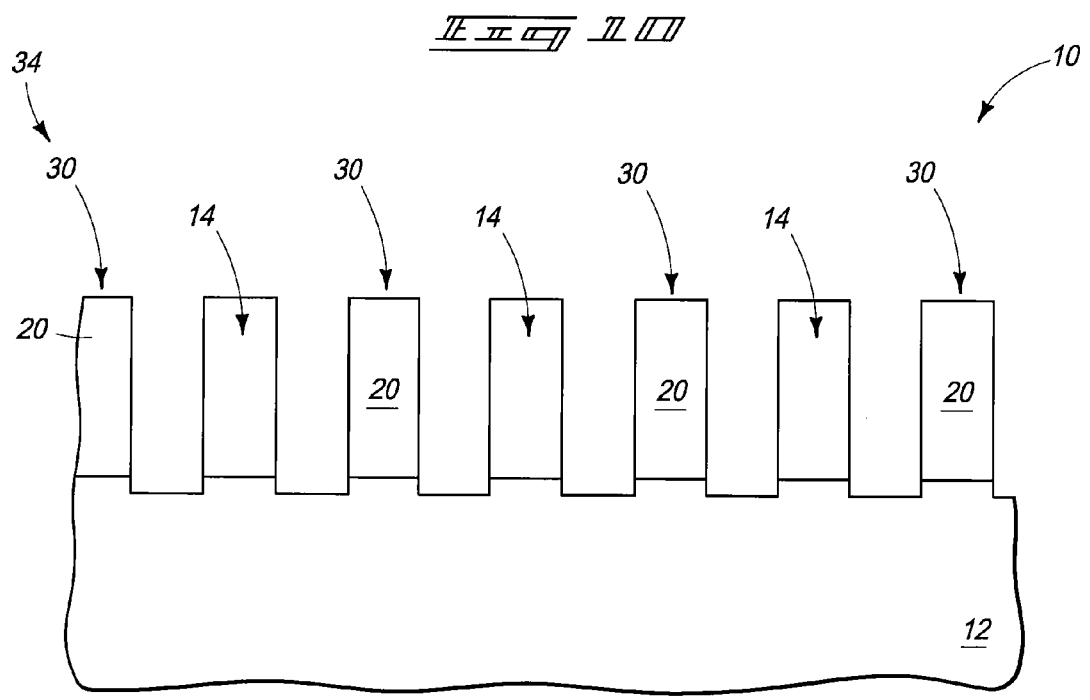
FIG. 11 is a view of the FIG. 10 substrate at a processing step subsequent to that shown by FIG. 10.

Embodiments of the invention may also comprise processing the substrate through a mask pattern which comprises the spaced first features and the material from which the spaced second features are formed. FIG. 11 depicts one such example wherein substrate 10 has been processed by etching through a mask pattern comprised of pattern 34 to etch into material 12. Any alternate existing or yet-to-be developed processing might also or alternately be conducted, for example doping, ion implanting, selective deposition, etc.

Figure 12:
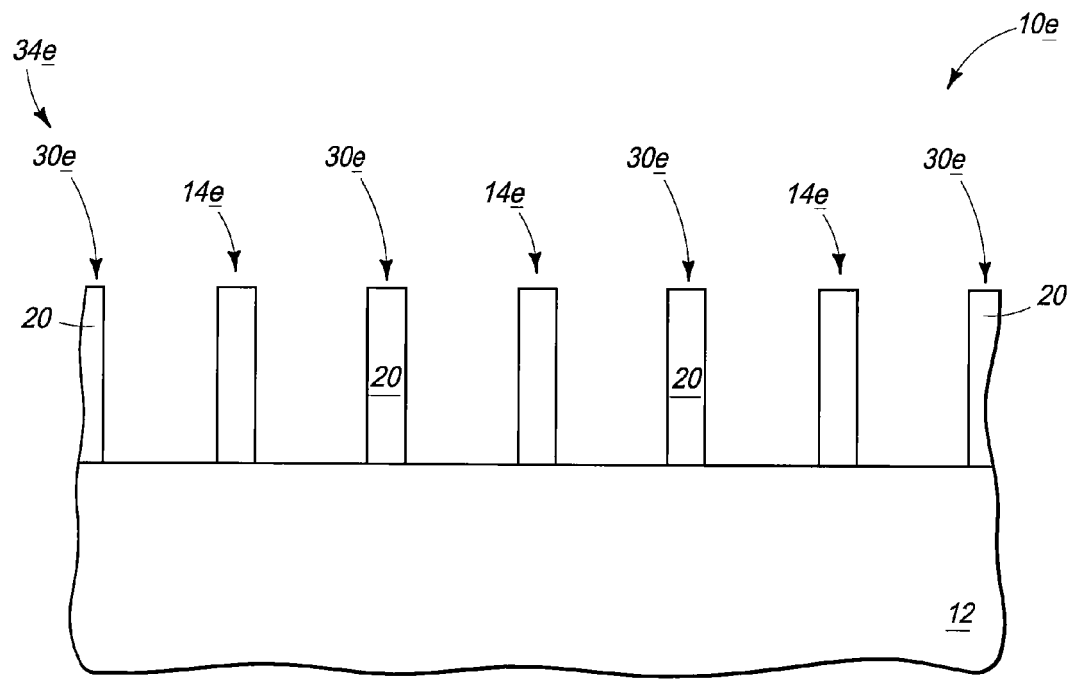
FIG. 12 is a view of an alternate embodiment substrate.

Alternate or additional processing is next described with respect to a substrate 10e in FIGS. 12-15. Like numerals from the first-described embodiment have been utilized where appropriate, with some construction differences being indicated with the suffix "e" or with different numerals. Referring to FIG. 12, a pattern 34e has been formed which comprises spaced first features 14e and spaced second features 30e. Such may be manufactured in accordance with any of the above-described techniques with respect to spaced first features 14 and spaced second features 30.

Figure 13:
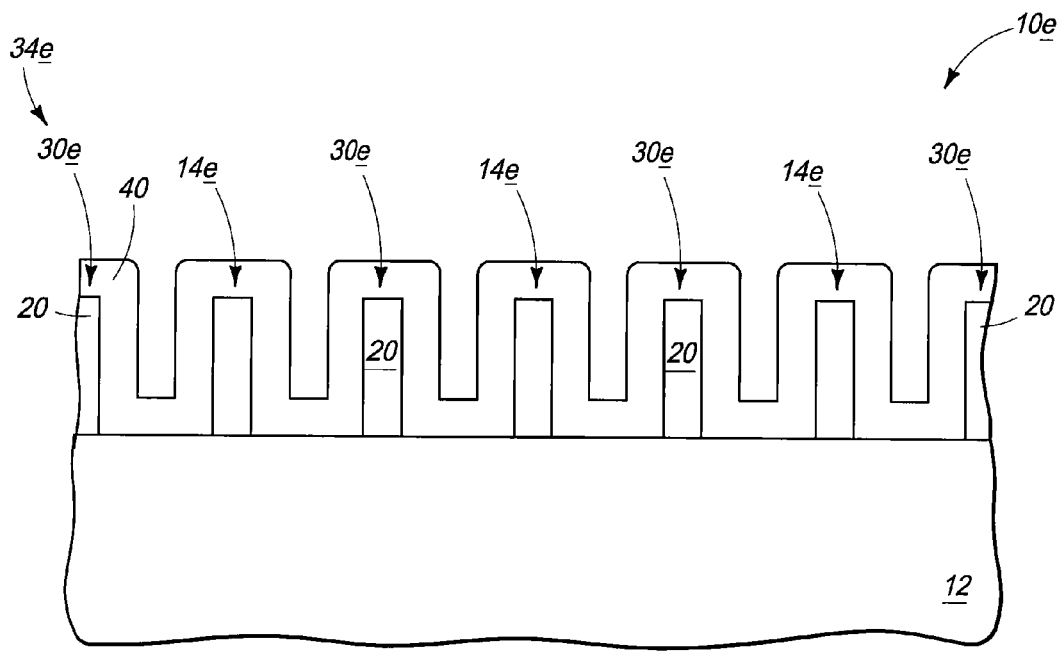
FIG. 13 is a view of the FIG. 12 substrate at a processing step subsequent to that shown by FIG. 12.

Referring to FIG. 13, a spacer-forming layer 40 has been deposited over features 14e and 30e. Such may comprise a material from which features 14e and features 30e may be selectively etched. In the context of this document, a selective etch requires removal of one material relative to another at a rate of at least 2:1. Spacer-forming layer 40 has been deposited to a thickness which less than fills the space between immediately adjacent of spacers 14e and 30e.

Figure 14:
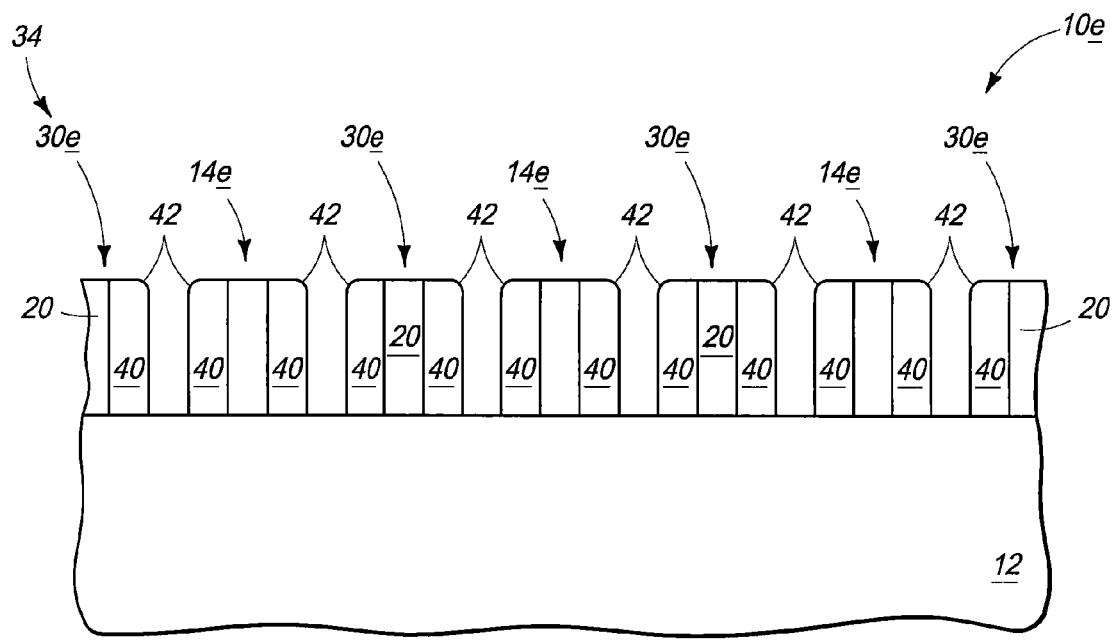
FIG. 14 is a view of the FIG. 13 substrate at a processing step subsequent to that shown by FIG. 13.

Referring to FIG. 14, spacer-forming layer 40 has been anisotropically etched to form spaced spacers 42 over lateral sidewalls of the materials of first features 14e and second features 30e.

Figure 15:
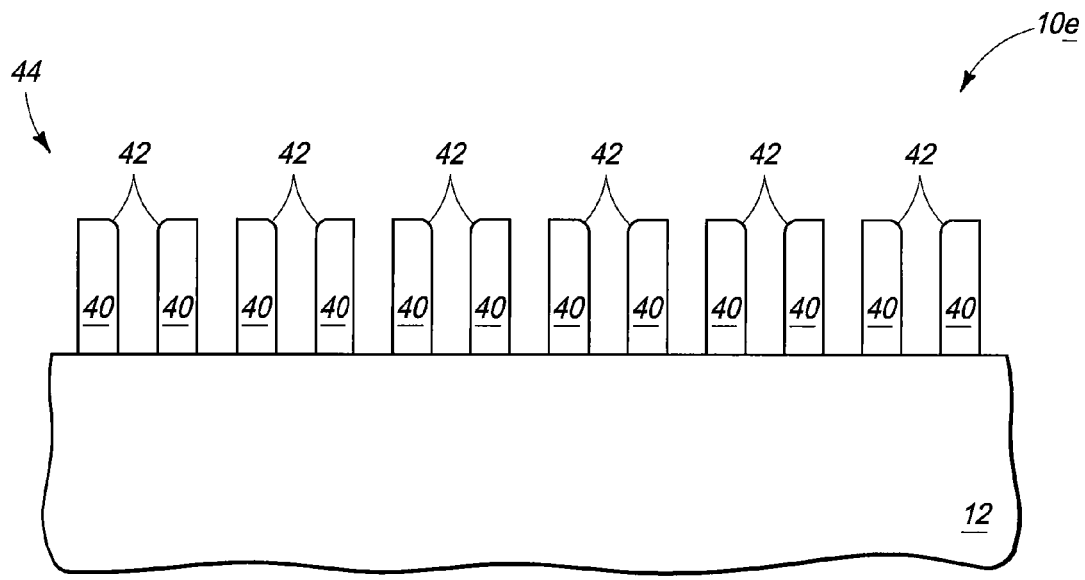
FIG. 15 is a view of the FIG. 14 substrate at a processing step subsequent to that shown by FIG. 14.

Referring to FIG. 15, spaced first features 14e (not shown) and spaced second features 30e (not shown) have been removed from the substrate selectively relative to spaced spacers 42, for example using any suitable etching chemistry depending upon the composition of the materials 14e, 30e, and 42. Thereby, a pattern 44 has been formed on substrate 12. Such may or may not be used as a mask pattern in the subsequent processing of substrate 12 there-through.

Figure 16:
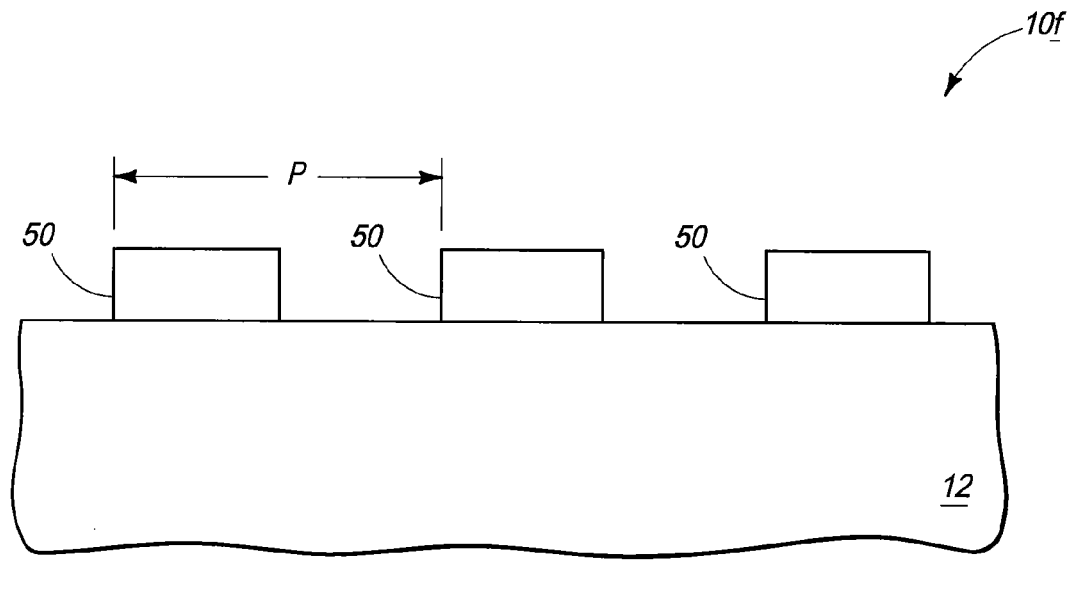
FIG. 16 is a view of an alternate embodiment substrate.

Another example embodiment is described with reference to a substrate 10f in FIG. 16-24. Like numerals from the first-described embodiment have been utilized where appropriate, with some construction differences being indicated with the suffix "f" or with different numerals. FIG. 16 depicts formation of spaced mask features 50, for example comprising, consisting essentially of, or consisting of photoresist. Mask features 50 have been fabricated over substrate 12 in a repeating pattern of a pitch "P". Mask features 50 may comprise material other than photoresist. Regardless, pitch P may be equal to, greater than, or less than the minimum photolithographic resolution with which substrate 10f is fabricated.

Figure 17:
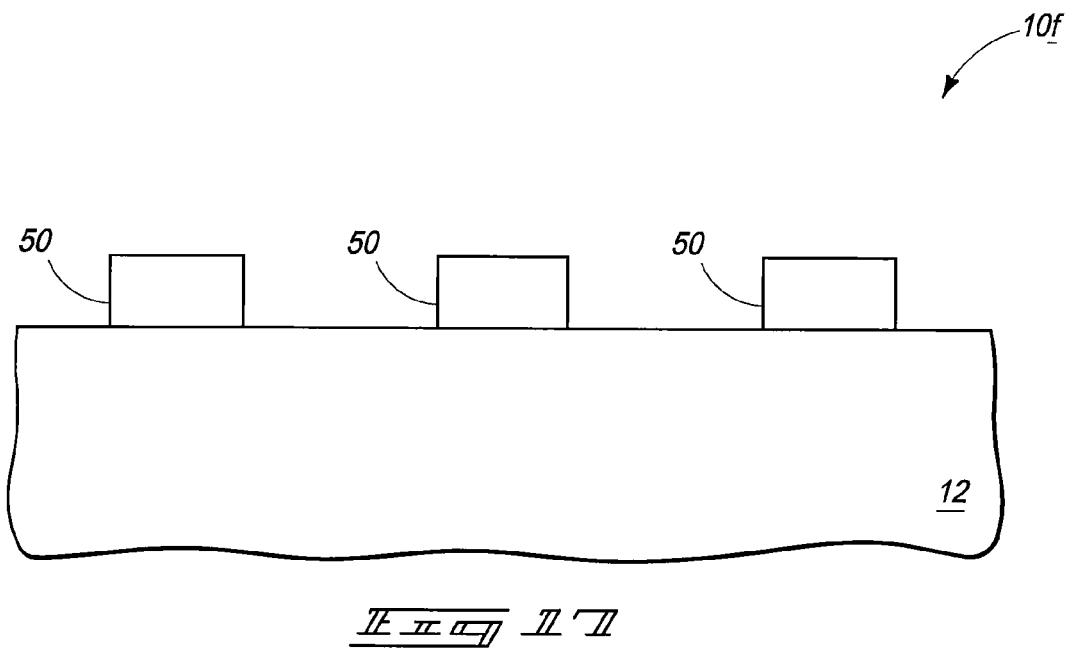
FIG. 17 is a view of the FIG. 16 substrate at a processing step subsequent to that shown by FIG. 16.

Referring to FIG. 17, mask features 50 have been laterally trimmed to reduce their respective widths.

Figure 18:
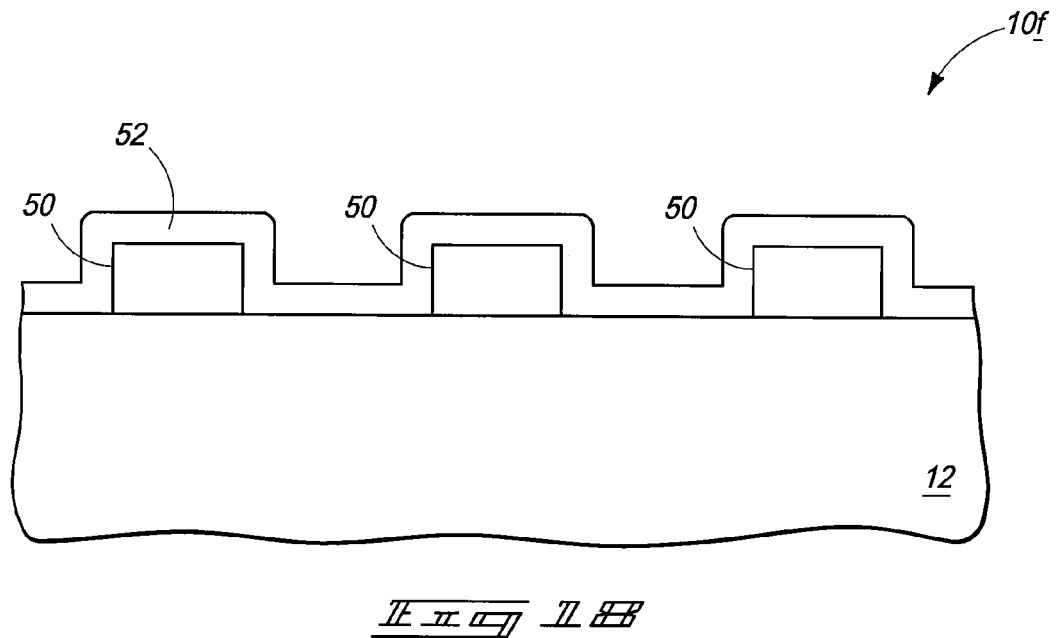
FIG. 18 is a view of the FIG. 17 substrate at a processing step subsequent to that shown by FIG. 17.

Referring to FIG. 18, a spacer-forming layer 52 has been deposited over substrate 12, including over spaced features 50.

Figure 19:
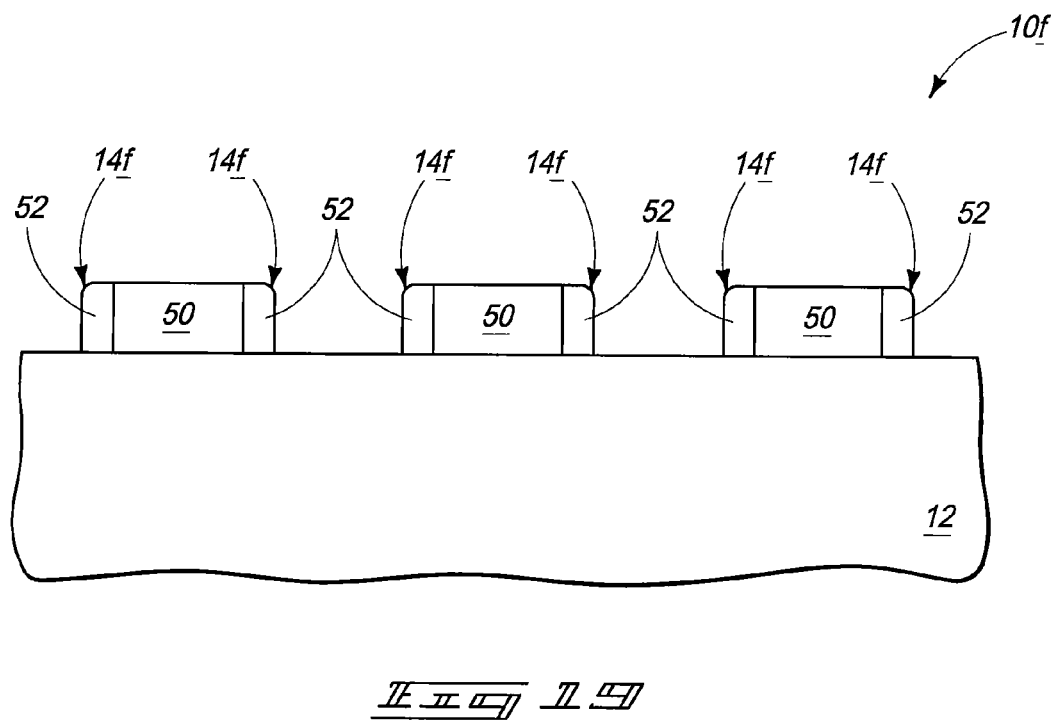
FIG. 19 is a view of the FIG. 18 substrate at a processing step subsequent to that shown by FIG. 18.

Referring to FIG. 19, spacer-forming layer 52 has been anisotropically etched to form spaced first features 14f about sidewalls of spaced features 50.

Figure 20:
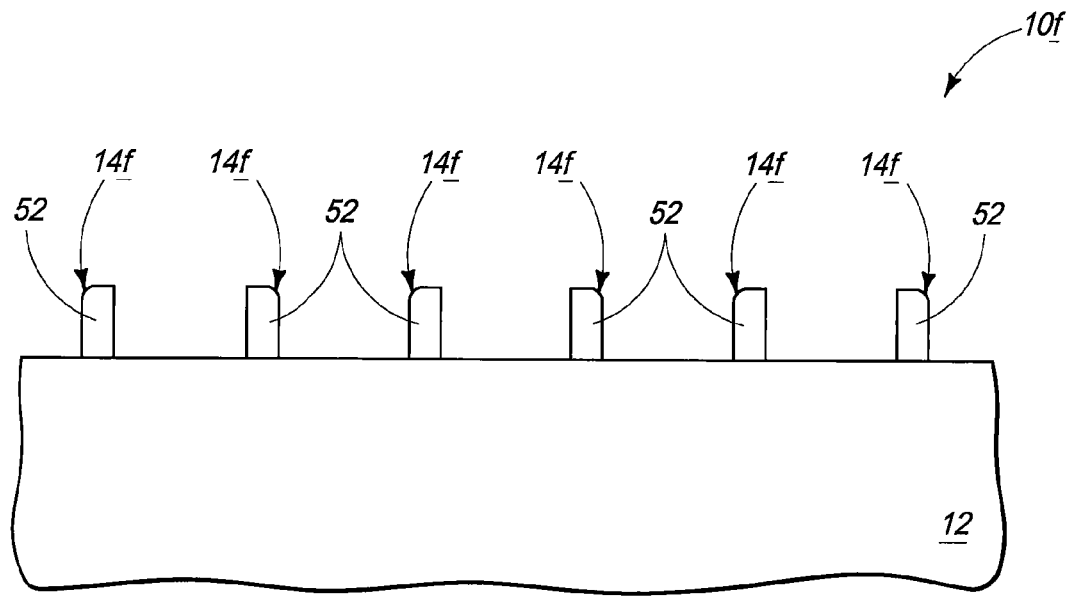
FIG. 20 is a view of the FIG. 19 substrate at a processing step subsequent to that shown by FIG. 19.

Referring to FIG. 20, spaced features 50 (not shown) have been removed from the substrate selectively relative to spaced first features 14f.

Figure 21:
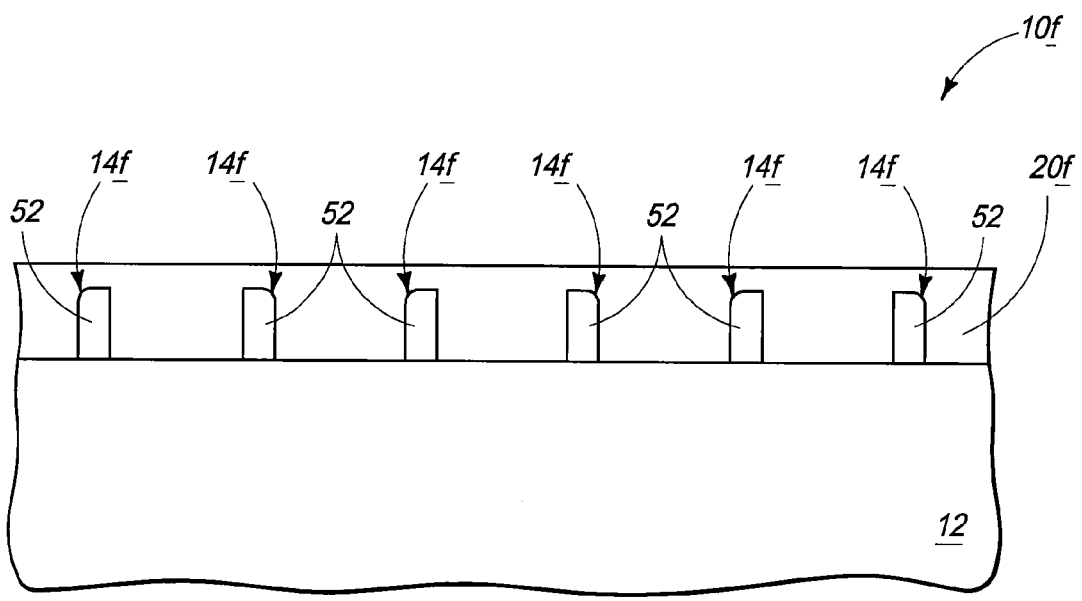
FIG. 21 is a view of the FIG. 20 substrate at a processing step subsequent to that shown by FIG. 20.

Referring to FIG. 21, material 20f has been formed. Material 52 of spaced first features 14f and material 20f correspond in composition to that of materials 14 and 20 as described above.

Figure 22:
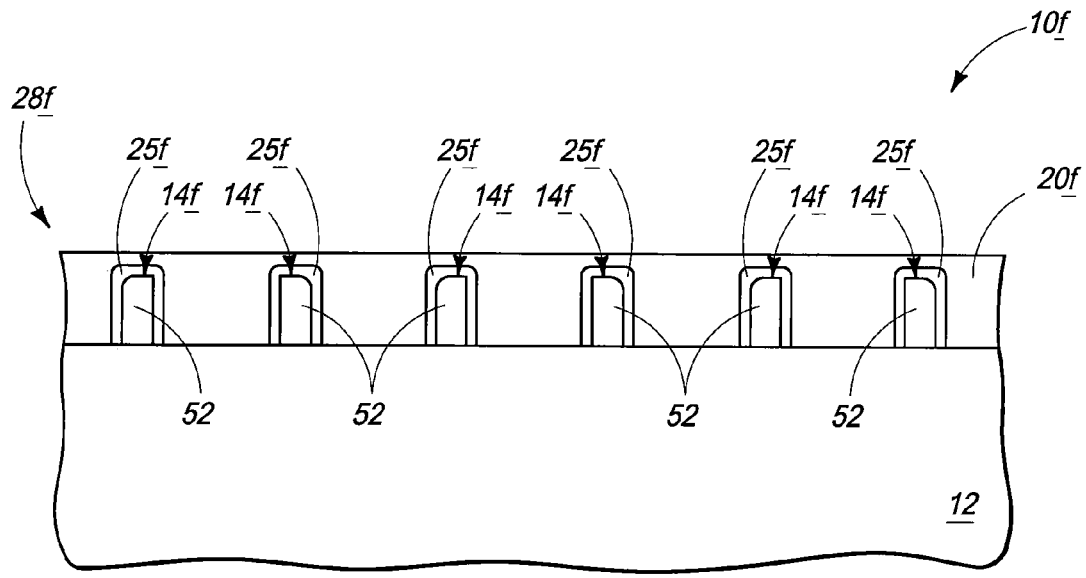
FIG. 22 is a view of the FIG. 21 substrate at a processing step subsequent to that shown by FIG. 21.

Referring to FIG. 22, at least one of the portion of material 20f adjacent material 52 and spaced first features 14f have been densified to be moved laterally away from the interface thereof. Such forms a void space 25f which is at least received between each of the opposing lateral sidewalls of spaced first features 14f and material 20f, and forms a pattern 28f.

Figure 23:
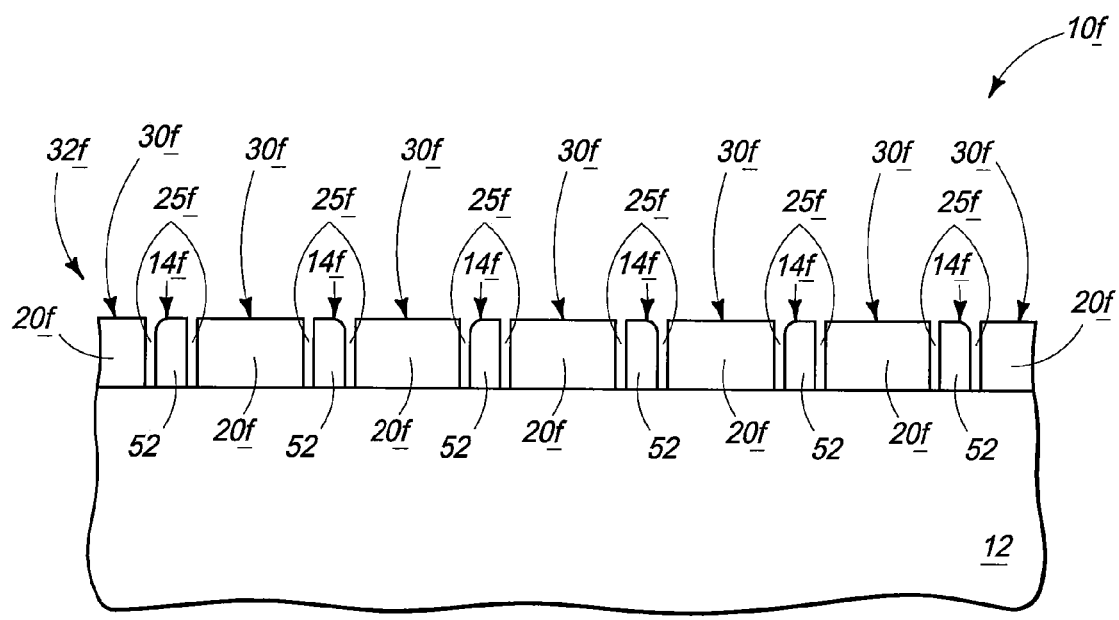
FIG. 23 is a view of the FIG. 22 substrate at a processing step subsequent to that shown by FIG. 22.

Referring to FIG. 23, outermost portions of material 20f have been removed to outwardly open the void spaces 25f. Such forms disconnected spacers 30f, and a pattern 32f.

Referring to FIG. 24, material 20f has been laterally trimmed to reduce its respective widths. Spaced first features 14f are shown as not having been laterally trimmed. Regardless, a pattern 60 is depicted as being formed over substrate 12. Pattern 60 is depicted as having a pitch which is one fourth (an integer factor of 4) that of pitch "P" of spaced mask features 50 in FIG. 16.

Any degree of pitch reduction (including non-integer fractional reduction) in any of the above-described embodiments, if occurring, will of course be in large part determined on the degree of any lateral trimming that may occur of the respective spaced features in combination with thickness of the deposited layers to produce the features and spaces between the features.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming spaced first features over a substrate, the spaced first features comprising opposing lateral sidewalls;
    forming material onto the opposing lateral sidewalls of the spaced first features, that portion of the material received against each of the opposing lateral sidewalls being of different composition from composition of each of the opposing lateral sidewalls; and
    densifying at least one of said portion of the material and the spaced first features to move the at least one laterally away from the other of the at least one to form a void space between each of the opposing lateral sidewalls and said portion of the material.

2. The method of claim 1 wherein at least one of the spaced first features and the material comprises photoresist.

3. The method of claim 1 wherein both of the spaced first features and the material comprise photoresist.

4. The method of claim 1 wherein neither of the spaced first features or the material comprises photoresist.

5. The method of claim 1 wherein the densifying and the move are of only the one.

6. The method of claim 5 wherein the densifying and the move are of the spaced first features.

7. The method of claim 5 wherein the densifying and the move are of the material.

8. The method of claim 5 wherein the other expands to reduce its density and move toward the one.

9. The method of claim 1 wherein the densifying and the move are of both the one and the other.

10. The method of claim 1 wherein the densifying comprises heating.

11. The method of claim 10 wherein the densifying is in the absence of etching.

12. The method of claim 1 wherein the densifying comprises actinically irradiating.

13. The method of claim 1 wherein the void space upon initial formation is sealed elevationally outward by the material in cross section.

14. The method of claim 13 comprising removing some of the material to open the void space elevationally outward after its initial formation and form disconnected spaced second features which are spaced from and alternate with the spaced first features.

15. The method of claim 1 wherein the void space upon initial formation is open elevationally outward in cross section.

16. The method of claim 1 wherein the material is received over elevationally outermost surfaces of the spaced first features during said densifying.

17. The method of claim 1 wherein none of the material is received over elevationally outermost surfaces of the spaced first features during said densifying.

18. The method of claim 1 wherein no material is received over elevationally outermost surfaces of the spaced first features during said densifying.

19. The method of claim 1 comprising after the densifying, processing the substrate through a mask pattern comprising the spaced first features and the material.

20. The method of claim 1 comprising:
    after the densifying, forming spaced spacers over lateral sidewalls of the material and over the opposing lateral sidewalls of the first features;
    removing the material and the first features from the substrate selectively relative to the spaced spacers; and
    after the removing, processing the substrate through a mask pattern comprising the spaced spacers.

21. A method of forming a pattern on a substrate, comprising:
    forming spaced first features over a substrate, the spaced first features comprising opposing lateral sidewalls and a top wall;
    forming material onto the opposing lateral sidewalls and the top wall of the spaced first features, that portion of the material received against each of the opposing lateral sidewalls and the top wall being of different composition from composition of each of the opposing lateral sidewalls and the top wall; and
    treating the substrate to form an upside-down generally U-shaped void space about each of the spaced first features in at least one cross section.

22. The method of claim 21 comprising removing a base of the upside-down generally U-shaped void space to form disconnected spaced second features which are spaced from and alternate with the spaced first features.

23. The method of claim 22 comprising laterally trimming the disconnected spaced second features to reduce their respective widths.

24. The method of claim 22 comprising laterally trimming the spaced first features after the removing to reduce their respective widths.

25. A method of forming a pattern on a substrate, comprising:
    forming spaced first features over a substrate, the spaced first features comprising opposing lateral sidewalls which are generally parallel one another;
    forming material onto the opposing lateral sidewalls of the spaced first features, that portion of the material received against each of the opposing lateral sidewalls being of different composition from composition of each of the opposing lateral sidewalls; and
    forming spaced second features over the substrate which comprise the material and which are spaced from and received between the spaced first features, the forming of said spaced second features comprising densifying at least one of said portion of the material and the spaced first features to move the at least one laterally away from the other of the at least one to form a void space between each of the opposing lateral sidewalls and said portion of the material.

26. The method of claim 25 wherein the spaced first features are homogenous.

27. The method of claim 25 comprising forming the material over elevationally outermost surfaces of the spaced first features.

28. The method of claim 27 wherein the material is received over the elevationally outermost surfaces of the spaced first features during said densifying.

29. The method of claim 27 comprising removing the material from being received over the elevationally outermost surfaces of the spaced first features prior to said densifying.

30. The method of claim 27 comprising after forming the spaced second features, laterally trimming the spaced first features to reduce their respective widths.

31. The method of claim 27 comprising after completing the densifying, laterally trimming the spaced second features to reduce their respective widths.

32. The method of claim 27 comprising:
   after forming the spaced second features, laterally trimming the spaced first features to reduce their respective widths; and
   after completing the densifying, laterally trimming the spaced second features to reduce their respective widths.

33. The method of claim 32 comprising laterally trimming the spaced second features after laterally trimming the spaced first features.

34. The method of claim 32 comprising laterally trimming the spaced second features before laterally trimming the spaced first features.

35. The method of claim 32 comprising laterally trimming the spaced first and second features at the same time.

* * * * *